US010094988B2

(12) United States Patent
Sandhu

(10) Patent No.: US 10,094,988 B2
(45) Date of Patent: Oct. 9, 2018

(54) METHOD OF FORMING PHOTONICS STRUCTURES

(75) Inventor: Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/600,779

(22) Filed: Aug. 31, 2012

(65) Prior Publication Data
US 2015/0198775 A1    Jul. 16, 2015

(51) Int. Cl.
| H01L 21/00 | (2006.01) |
| H01L 31/107 | (2006.01) |
| H01L 29/84 | (2006.01) |
| G02B 6/42 | (2006.01) |
| H01L 27/06 | (2006.01) |
| G02B 6/122 | (2006.01) |
| H01L 31/0232 | (2014.01) |
| H01L 31/18 | (2006.01) |
| G02B 6/12 | (2006.01) |
| H01L 21/324 | (2006.01) |

(52) U.S. Cl.
CPC ............ G02B 6/42 (2013.01); G02B 6/122 (2013.01); H01L 27/0617 (2013.01); H01L 31/02327 (2013.01); H01L 31/1864 (2013.01); G02B 2006/12169 (2013.01); H01L 21/324 (2013.01)

(58) Field of Classification Search
CPC ............. H01L 27/12; H01L 29/06; H01L 2924/40402; H01L 2933/0083; H01L 31/0376
USPC ............ 438/708, 56, 73; 257/186, 227, 254, 257/E31.047
See application file for complete search history.

(56) References Cited

U.S. PATENT DOCUMENTS

| 5,304,509 A * | 4/1994 | Sopori ............... H01L 21/3003 136/258 |
| 5,424,244 A * | 6/1995 | Zhang ............... B60R 25/066 257/E21.141 |
| 5,938,839 A * | 8/1999 | Zhang ............... H01L 21/223 117/104 |
| 6,018,187 A * | 1/2000 | Theil ................. H01L 27/14632 257/444 |
| 6,968,110 B2 | 11/2005 | Patel et al. |
| 8,228,409 B2 * | 7/2012 | Han ................. H01L 27/14632 257/291 |

(Continued)

FOREIGN PATENT DOCUMENTS

| CN | 101471372 A | 7/2009 |
| CN | 102341890 | 2/2012 |

(Continued)

OTHER PUBLICATIONS

Yao-Jen Lee, "Dopant Activation by Microwave Anneal", Junction Technology (IWJT), 2011 11th International Workshop on, IEEE, Jun. 9, 2011, pp. 44-49.

(Continued)

*Primary Examiner* — Sheikh Maruf
(74) *Attorney, Agent, or Firm* — Perkins Coie LLP

(57) ABSTRACT

The disclosed embodiments relate to an integrated circuit structure and methods of forming them in which photonic devices are formed on the back end of fabricating a CMOS semiconductor structure containing electronic devices. Doped regions associated with the photonic devices are formed using microwave annealing for dopant activation.

15 Claims, 3 Drawing Sheets

(56) References Cited

U.S. PATENT DOCUMENTS

| | | | |
|---|---|---|---|
| 8,399,292 B2* | 3/2013 | Doany et al. | 438/106 |
| 8,531,565 B2* | 9/2013 | Wang | H01L 27/1463 348/241 |
| 2002/0117682 A1* | 8/2002 | Vande Voorde | H01L 27/14681 257/149 |
| 2004/0012041 A1* | 1/2004 | West | G02B 6/12 257/228 |
| 2004/0063298 A1* | 4/2004 | Aga | H01L 21/76254 438/406 |
| 2004/0114853 A1* | 6/2004 | Bjorkman | G02B 6/12 385/14 |
| 2004/0235281 A1 | 11/2004 | Downey et al. | |
| 2006/0011808 A1 | 1/2006 | Li et al. | |
| 2006/0105552 A1* | 5/2006 | Kim | H01L 21/26513 438/522 |
| 2007/0020892 A1 | 1/2007 | Kim | |
| 2007/0170417 A1 | 7/2007 | Bowers | |
| 2008/0042230 A1* | 2/2008 | Miida | H01L 27/14623 257/458 |
| 2008/0206977 A1* | 8/2008 | Frank | H01L 21/768 438/597 |
| 2008/0315351 A1* | 12/2008 | Kakehata | H01L 27/112 257/507 |
| 2009/0022500 A1 | 1/2009 | Pinguet et al. | |
| 2009/0166786 A1* | 7/2009 | Shim | 257/440 |
| 2009/0188557 A1* | 7/2009 | Wang et al. | 136/256 |
| 2010/0059822 A1* | 3/2010 | Pinguet | H01L 21/84 257/351 |
| 2010/0062562 A1 | 3/2010 | Smythe et al. | |
| 2010/0083556 A1* | 4/2010 | Wright et al. | 43/1 |
| 2010/0103298 A1* | 4/2010 | Han | H01L 27/14632 348/294 |
| 2010/0110607 A1* | 5/2010 | DeNatale | H01G 4/012 361/311 |
| 2010/0133704 A1* | 6/2010 | Marimuthu | H01L 21/565 257/778 |
| 2010/0140708 A1* | 6/2010 | Hill | G02B 6/136 257/348 |
| 2010/0155803 A1* | 6/2010 | Sandhu | H01L 21/84 257/310 |
| 2010/0193897 A1* | 8/2010 | Sinha et al. | 257/506 |
| 2010/0213560 A1* | 8/2010 | Wang | H01L 27/14621 257/432 |
| 2010/0220226 A1* | 9/2010 | Wang | H01L 27/1463 348/294 |
| 2010/0304520 A1 | 12/2010 | Hiyama | |
| 2011/0036289 A1* | 2/2011 | Carothers | H01L 21/02381 117/94 |
| 2011/0039421 A1* | 2/2011 | Jang | B32B 37/0015 438/795 |
| 2011/0143480 A1* | 6/2011 | Hilali | H01L 21/324 438/58 |
| 2011/0241082 A1* | 10/2011 | Bernstein | H01L 23/481 257/255 |
| 2011/0287571 A1* | 11/2011 | Bourdelle et al. | 438/73 |
| 2012/0001166 A1* | 1/2012 | Doany et al. | 257/47 |
| 2012/0034769 A1* | 2/2012 | Purtell et al. | 438/530 |
| 2012/0086107 A1* | 4/2012 | Yamamoto et al. | 257/632 |
| 2012/0129302 A1* | 5/2012 | Assefa et al. | 438/154 |
| 2012/0161270 A1* | 6/2012 | Maehara | B82Y 10/00 257/432 |
| 2012/0184064 A1* | 7/2012 | Isaka | H01L 31/03762 438/96 |
| 2012/0223436 A1* | 9/2012 | Sekar et al. | 257/773 |
| 2012/0252158 A1* | 10/2012 | Carothers | H01L 27/1467 438/87 |
| 2012/0306082 A1* | 12/2012 | Sekar | H01L 23/3677 257/758 |
| 2012/0320939 A1* | 12/2012 | Baets et al. | 372/45.01 |
| 2012/0322177 A1* | 12/2012 | Pomerene | H01L 27/13 438/22 |
| 2013/0014823 A1* | 1/2013 | Ko | H01L 31/0481 136/259 |
| 2013/0267083 A1 | 10/2013 | Suguro | |
| 2013/0322811 A1* | 12/2013 | Meade | 385/14 |

FOREIGN PATENT DOCUMENTS

| | | |
|---|---|---|
| EP | 2 200 084 A1 | 6/2010 |
| JP | 08316449 A | 11/1996 |
| JP | 2000133792 A | 5/2000 |
| JP | 2003517635 A | 5/2003 |
| JP | 2005123513 A | 5/2005 |
| JP | 2006133723 A | 5/2006 |
| JP | 2006525677 A | 11/2006 |
| JP | 2007535174 A | 11/2007 |
| JP | 2008-66410 A | 3/2008 |
| JP | 2009058888 A | 3/2009 |
| JP | 2010278175 A | 12/2010 |
| JP | 2012053399 A | 3/2012 |
| JP | 2012513118 A | 6/2012 |
| JP | 2012134460 A | 7/2012 |
| WO | 2010004850 A1 | 1/2010 |
| WO | 2010028355 A1 | 3/2010 |
| WO | 2012008272 A1 | 1/2012 |

OTHER PUBLICATIONS

JM. Fedeli et al., "Integration Issues of a Photonic Layer on Top of a CMOS Circuit," Proc. of SPIE, vol. 6125, pp. 61250H-1-61250H-15, 2006.

Jean-Marc Fedeli, "Silicon Photonics Integration with Electronic Circuit," IEEE 978-1-4577-0502-1/11, pp. 1-3, 2011.

JM. Fedeli et al., "Incorporation of a Photonic Layer at the Metallization Levels of a CMOS Circuit," IEEE 1-4244-0096-1/06, pp. 200-202, 2006.

JM. Fedeli et al., "Optical Interconnect: A Back End Integration Scheme for Waveguides and Optoelectronic InP Components," Proc. of SPIE, vol. 5956, pp. 595607-1-595607-9, 2005.

J. M. Kowalski et al., "Microwave Annealing for Low Temperature Activation of As in Si," 15th IEEE International Conference on Advanced Thermal Processing of Semiconductors—RTP2007, 2007.

D.C. Thompson et al., "Microwave Activation of Dopants & Solid Phase Epitaxy in Silicon," Mater. Res. Soc. Symp. Proc., vol. 989, Materials Research Society, 2007.

Office Action dated Dec. 10, 2015 in Korea Application No. 10-2015-706969, 6 pages.

Ofice Action dated May 27, 2015 in Taiwan Application No. 102131419, 7 pages.

Written Opinion dated Nov. 30, 2015 in Singapore Application No. 11201500915S, 7 pages.

Office Action dated Jun. 29, 2016 in Korean Application No. 10-2015-7006969, 8 pages.

Written Opinion dated Jun. 15, 2016 in Singapore Application No. 11201500915S, 7 pages.

Office Action dated Dec. 2, 2016 in Chinese application No. 201380044708.0, 13 pages.

Office Action dated Apr. 12, 2016 in Japan Application No. 2015-529848, 8 pages.

Office Action dated Dec. 26, 2016 in Korean application No. 10-2015-7006969, 6 pages.

Office Action dated Dec. 6, 2016 in Japan Application No. 2015-529848, 6 pages.

Exam Report dated Mar. 22, 2017 in European application No. 13753241.2, 7 pages.

Office Action dated Mar. 21, 2017 in Japan Application No. 2015-529848, 4 pages.

* cited by examiner

METHOD OF FORMING PHOTONICS STRUCTURES

This invention was made with Government support under Agreement No. HR0011-11-9-0009, awarded by DARPA. The Government has certain rights in this invention.

FIELD OF THE INVENTION

Embodiments of the invention relate generally to manufacturing of photonic structures and electronic devices over silicon wafers, and specifically directed to methods of forming photonic structures at the back-end of a CMOS process flow.

BACKGROUND OF THE INVENTION

Photonics over silicon have generated increasing interest over the years, primarily for optical transmission and optical interconnects in microelectronics circuits. Photonic devices such as waveguides, modulators and detectors are usually formed with silicon or polysilicon and germanium materials on a semiconductor-on-insulator (SOI) or bulk silicon wafer utilizing a complementary metal-oxide semiconductor (CMOS) process. One conventional method of integrating photonic devices into the CMOS process flow occurs at the front-end of the CMOS processing line. The typical front-end method involves first fabricating photonic devices on a substrate and then fabricating electronic devices (e.g., transistors) on a single CMOS wafer with different silicon material thicknesses for the photonic devices and the electronic devices.

Front-end integration of photonic devices presents the problem that the additional processing steps required to make the photonic devices can interfere with the conventional CMOS process flow. For instance, front-end integration of photonic devices on a silicon on insulator (SOI) wafer requires a substrate having a thicker (>1 µm) buried oxide material and a thicker (>200 nm) silicon material compared to standard CMOS electronic SOI devices which may use a substrate having a <1 µm thick buried oxide material and a <200 nm thick silicon material. The additional processing steps required to make photonic devices in the front-end of the conventional CMOS processing line increases overall complexity and cost of an integrated circuit containing both CMOS electronics devices and photonics devices. In addition, for a side-by-side layout of CMOS electronic devices and photonics devices, the photonic devices take up valuable substrate space that could be used for electronic devices. Improved methods to make photonic devices in the back-end of a CMOS processing line are desired.

DETAILED DESCRIPTION OF THE INVENTION

Figure 1:
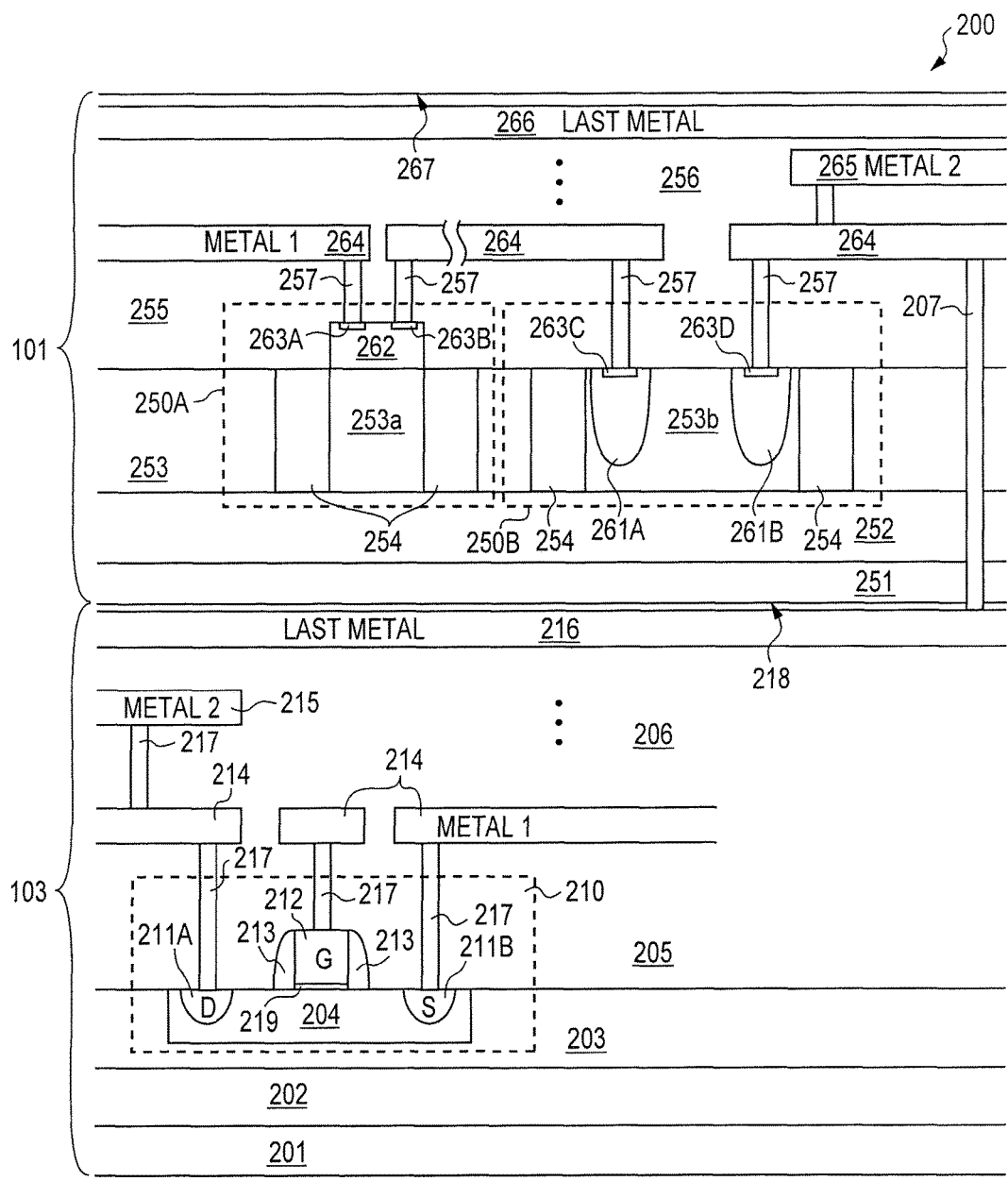
FIG. 1 shows photonic and electronic devices fabricated in a single CMOS semiconductor structure in accordance with a disclosed embodiment.

In the following detailed description, reference is made to the accompanying drawings which form a part hereof, and in which is shown by way of illustration specific embodiments that may be practiced. It should be understood that like reference numbers represent like elements throughout the drawings. These embodiments are described in sufficient detail to enable those skilled in the art to make and use them, and it is to be understood that structural, material, electrical, and procedural changes may be made to the specific embodiments disclosed, only some of which are discussed in detail below.

The terms "wafer" and "substrate" are to be understood as interchangeable and as including silicon, silicon-on-insulator (SOI) or silicon-on-sapphire (SOS), doped and undoped semiconductors, epitaxial materials of silicon supported by a base semiconductor foundation, and other semiconductor structures. Furthermore, when reference is made to a "wafer" and "substrate" in the following description, previous process steps may have been utilized to form regions, junctions, or material layers in or on the base semiconductor structure or foundation. In addition, the semiconductor need not be silicon-based, but could be based on silicon-germanium, germanium, gallium arsenide, or other known semiconductor materials.

Photonic devices include photonic waveguides, modulators, demodulators, and photodetectors, among other devices. Dopant activation is often required to make active photonic devices (e.g., photodetectors, modulators) function and to create ohmic electrical contact areas. In forming active photonic devices and ohmic contacts, the dopant region can be formed by implanting the dopant atoms into a semiconductor material and then activating the dopant by thermally heating it. Heating of the dopant at a high temperature (e.g., 1000° Celsius), requires that the dopant activation step occur before metallization, because the metallization materials can be damaged by such high temperatures. It is for this reason that photonics devices are formed before the completion of CMOS circuits and before formation of metallization materials which interconnect photonics and electrical devices. One challenge with creating active photonic devices at the back-end of the CMOS process flow, after metallization of CMOS circuits occurs, is the use of low temperatures (i.e., below about 500° Celsius) to prevent damage to the CMOS circuits and metallization.

Described herein are methods of integrating photonics devices in a conventional CMOS process flow. The disclosed embodiments relate to methods of forming photonic and electronic devices on a single CMOS semiconductor structure at the back-end of the CMOS process flow. The photonic devices are formed using low deposition temperature polysilicon, germanium and silicon-germanium techniques such as, for example, physical vapor deposition (PVD), chemical vapor deposition (CVD), plasma-enhanced CVD (PECVD), spin-on-glass (SOG) deposition, and atomic layer deposition (ALD). The disclosed embodiments also utilize electromagnetic, such as microwave, annealing at temperatures between about 200° Celsius to about 500° Celsius, preferably about 300° Celsius to about 400° Celsius, for at least five (5) minutes and up to two (2) hours for dopant activation and annealing of the active photonic devices and ohmic contacts. Although any appropriate energy capable of being absorbed into the region being annealed is appropriate, for convenience, only microwave energy will be discussed hereafter. Microwave based activation techniques can effectively activate the desired dopants, for example, phosphorous, antimony, gallium, boron or arsenic doping atoms, without compromising front end CMOS circuits or metallization thereby enabling the full integration of photonics devices at the back-end of the CMOS process flow. Low temperature microwave annealing also results in less dopant migration out of (and into) the dopant region in the substrate and results in more uniform dopant concentration within the dopant region.

In front-end integration of photonics devices in a conventional CMOS process, the photonic devices are usually formed with silicon or polysilicon, germanium and silicon-germanium materials on a SOI wafer. Another advantage of the back-end integration is that photonics devices can be formed of additional materials, which might otherwise be affected by the processing used to form electronic devices if a front end process is used. For example, back end processing can use silicon nitride to form photonic devices, which has better photon propagation than polysilicon. For example, instead of fabricating a waveguide core using silicon or polysilicon on SOI substrates at the front end, the waveguide core could be formed of silicon nitride on an SOI substrate in a back end process.

Referring to the drawings, where like reference numbers designate like elements, FIG. 1 shows a partial cross-section view of one embodiment of a semiconductor structure 200 fabricated using back end processing to form a photonics integrated structure 101 over a CMOS integrated structure 103 on the same supporting substrate. The photonics integrated structure 101 includes, as an example, a photodetector 250A and a modulator 250B. The CMOS integrated structure 103 includes, as an example, an electronic device 210 fabricated as a transistor. The semiconductor structure 200 can be fabricated using the methods described below in connection with FIGS. 2 and 3.

The CMOS integrated structure 103 comprises a silicon substrate 201, a buried oxide (BOX) 202 formed of, for example, silicon dioxide, a silicon fabrication material 203, a gate oxide material 219, and alternating metal and insulating materials forming an interlayer dielectric (ILD) metallization structure which includes insulation (e.g., $SiO_2$ or BPSG) material 205, Metal 1 material 214, insulation (e.g., $SiO_2$ or BPSG) material 206, Metal 2 material 215, last Metal material 216, and a passivation material 218, for example, silicon dioxide. The Metal 1 material 214 is connected by via conductors 217 to the underlying circuitry of the electronic device 210.

The electronic device 210 is formed using the conventional CMOS process as known to those skilled in the art. The electronic device 210 comprises a doped well 204, drain 211A and source 211B implant regions, a gate 212 over the gate oxide material 219 and gate sidewall spacers 213. The gate 212 may be formed of polysilicon. The insulation material 205 covers the electronic device 210 and the silicon fabrication material 203, which is supported by the buried oxide (BOX) 202 and the silicon substrate 201.

The photonics integrated structure 101 is formed, in this embodiment, over the CMOS integrated structure 103 and comprises a semiconductor material 251 formed over passivation layer 218, an oxide material 252, a silicon fabrication material 253 in which photodetector 250A and modulator 250B are formed. Alternating metal and insulating materials form an ILD metallization structure which includes insulation (e.g., $SiO_2$ or BPSG) material 255, Metal 1 material 264, insulation (e.g., $SiO_2$ or BPSG) material 256, Metal 2 material 265, last Metal material 266, and passivation material 267.

The photodetector 250A can comprise a doped or un-doped germanium (Ge) or silicon-germanium (SiGe) region 262 formed over a silicon waveguide core 253a. The waveguide core 253a is surrounded by cladding material formed by oxide material 252 and isolation regions 254 which can be formed of silicon dioxide ($SiO_2$). The insulation material 255 also functions as part of the cladding for waveguide core 253a. The modulator 250B can be formed as a doped or un-doped silicon waveguide core 253b which has additionally doped regions 261A and 261B which can be connected by conductors 257 to modulate light within waveguide core 253b. The photonics structure 101 may also contain ohmic contact regions 263A, 263B, 263C, and 263D to create ohmic contacts with conductors 257. The ohmic contact regions may be, for example, highly doped contact regions or low temperature formed silicides, such as Ni silicides. For example, photodetector 250A can contain ohmic contact regions 263A and 263B and modulator 250B may contain ohmic contact regions 263C and 263D. Ohmic contact regions 263C and 263D may contain dopant quantities higher than that of doped regions 261A and 261B. The germanium (Ge) or silicon-germanium (SiGe) region 262 can be used as the photon detector in photodetector device 250A. The oxide material 252 and additional insulation 255 and isolation regions 254 materials may be used as cladding materials surrounding the silicon waveguide cores 253a and 253b. The insulation material 255, which may be silicon dioxide or BPSG, covers the photonic devices 250 and the silicon fabrication material 253. The photonic devices 250 may use a thicker (>1 μm) oxide material 252 and a thicker (>200 nm) silicon fabrication material 253 compared to the buried oxide (BOX) material 202 (<1 μm) and the silicon material 203 (<200 nm) on which the CMOS electronic devices 210 are formed.

Alternating metal and insulating materials in the photonics structure 101 form an ILD metallization structure which includes insulation (e.g., $SiO_2$ or BPSG) materials 255, 256, Metal 1 material 264, Metal 2 material 265, last Metal material 266 and a passivation material 267. The insulation materials 255, 256 provide electrical and optical isolation of the photodetector 250A and modulator 250B. The Metal 1 material 264 is connected by conductors 257 to the underlying photonics devices. Contact 207 connects the Metal 1 material 264 of the integrated photonic structure 101 to the last Metal material 216 of integrated CMOS structure 103 as an example of the electrical connection between structures 101 and 103. It shall be appreciated that the semiconductor structure 200 can be fabricated with any number of electronic and photonic devices and with any number of contacts 207 between structures 101 and 103 to form a desired electronic and photonic arrangement within semiconductor structure 200.

FIG. 1 is merely representative of a photonics circuit which includes waveguides 253a, 253b, and associated photodetector 250A and modulator 250B. However, any photonics devices can be integrated over an integrated CMOS structure 103 using the described fabrication techniques using microwave activation energy for activating dopants in a temperature range of about 200° Celsius to about 500° Celsius, preferably in the range of about 300° Celsius to about 400° Celsius, which does not affect the underlying integrated CMOS circuit 103.

Figure 2:
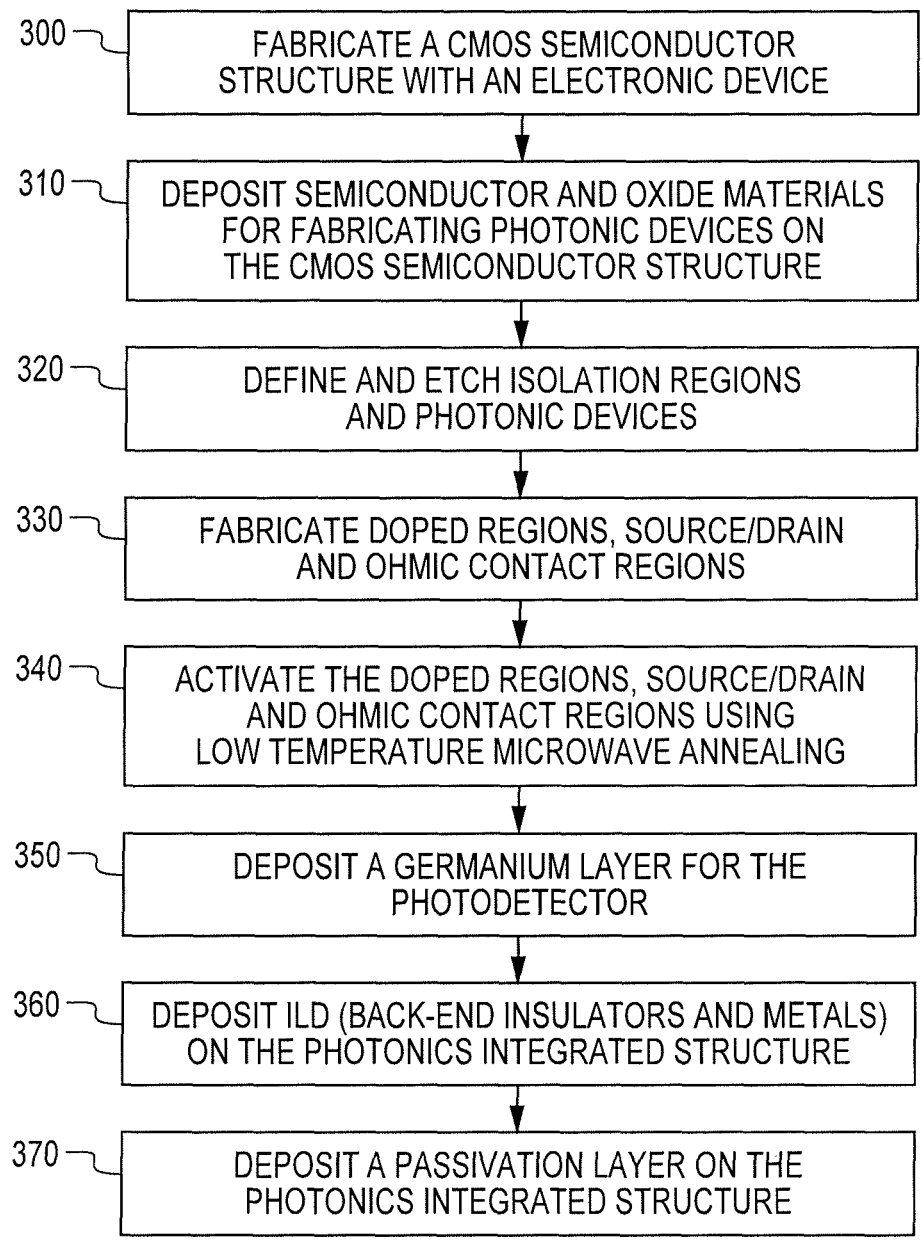
FIG. 2 shows a method of forming photonic and electronic devices in a single CMOS semiconductor structure in accordance with a disclosed embodiment; and, FIG. 3 shows a method of forming photonic and electronic devices in a single CMOS semiconductor structure in accordance with a disclosed embodiment.

FIG. 2 shows a method of forming the semiconductor structure 200 using back-end integration of the photonics devices in a CMOS process flow in accordance with a disclosed embodiment. A CMOS semiconductor structure 103 having one or more electronic devices 210 is first fabricated at step 300 using known CMOS process techniques. The CMOS structure includes the passivation layer 218. At step 310, associated materials for the photonic structure 101 are deposited over the CMOS integrated structure 103. These include semiconductor material 251, e.g. silicon, oxide material 252, and a fabrication semiconductor material 253. The semiconductor material 251 is deposited over the passivation protection material 218, an oxide material 252 with appropriate thickness for forming the photonic devices 250 (e.g., >1 µm) is deposited over the semiconductor material 251, and a silicon fabrication material 253 with appropriate thickness for the photonic devices 250 (e.g., >200 nm) is deposited over the oxide material 252. The materials 251, 252 and 253 are deposited with low temperature deposition techniques, for example, physical vapor deposition (PVD), chemical vapor deposition (CVD), plasma-enhanced CVD (PECVD), spin-on-glass (SOG) deposition, and atomic layer deposition (ALD). At step 320, isolation regions 254, for example, trench isolation regions, are defined and etched in the silicon fabrication material 253 using, for example, photolithography, etching, fill, and chemical-mechanical polishing (CMP), to produce the isolation regions 254 at desired locations in the semiconductor fabrication material 253. The isolation regions 254 define areas in the fabrication material 253 where photonics devices, e.g. photodetector 250A and modulator 250B are to be formed.

At step 330, doped regions 261A, 261B are formed within the silicon core 253b between two isolation regions 254 for modulator 250B. At this step other doped regions may also be formed, for example, silicon waveguide core 253b may be doped and ohmic contact regions 263C, 263D can also be doped. The dopants are those typically used in forming integrated circuits, e.g. boron, phosphorus, antimony, gallium and arsenic. The doped regions may be formed, for example, to an atomic concentration of about $1 \times 10^{16}$ to about $1 \times 10^{21}$ dopants per cm$^3$. In addition to the formation of doped regions, low temperature silicide materials, such as Ni, may also be applied to form ohmic contact regions. At step 340, the doped regions 261A and 261B, as well as any other doped regions and silicide materials are annealed and activated using low temperature microwave annealing. In forming active photonic devices, the dopant region (e.g., 261A and 261B) is formed by implanting the dopant atoms into the semiconductor material (e.g., silicon fabrication material 253) and then activating the dopant by heating it. Dopant activation of the active photonic devices can be achieved by microwave annealing inside, for example, a cavity applicator microwave system operating at about 2.45 GHz at about 1300 W, or for example by a microwave system operating in a range of wavelengths between about 1.5 to about 8.5 GHz, although any suitable frequency and power can be used. Using a low temperature to activate the dopants will not disturb the underlying CMOS structure 103. The microwave system heats the fabricated CMOS structure 103 and the partially completed photonics integrated structure 101 to temperatures between about 200° Celsius to about 500° Celsius, preferably about 300° Celsius to about 400° Celsius, for at least about 5 minutes and up to about two (2) hours. Microwave based activation techniques can effectively activate the desired dopants, for example, phosphorous, antimony, gallium, boron or arsenic doping atoms. Steps 330 and 340 may be repeated to define and activate additional doping regions and ohmic contact regions.

At step 350, the germanium (or silicon-germanium) material 262 is deposited on the silicon material 253a, the later of which functions as a waveguide core. Ohmic contacts 263A, 263B are also implanted into or applied to the material 262. At step 360, an interlayer dielectric structure (ILD) is formed using back-end insulators 255, 256 and metal materials (e.g., one or more of Metal 1 material 264, via 1 material 256, Metal 2 material 265 and last Metal material 266) are deposited to provide electrical contact between associated materials of the photonic semiconductor structure and to the photonic devices 250. Also, contacts 207 between structures 101 and 103 are formed. The insulator 255, together with isolation regions 254 and oxide material 252 provide cladding around waveguide core 253a. The photodetector material 262 detects light within waveguide core 253a. After all metal and insulator layers of the ILD are formed, at step 370, the passivation material 267 is deposited on the CMOS semiconductor structure 200.

Figure 3:
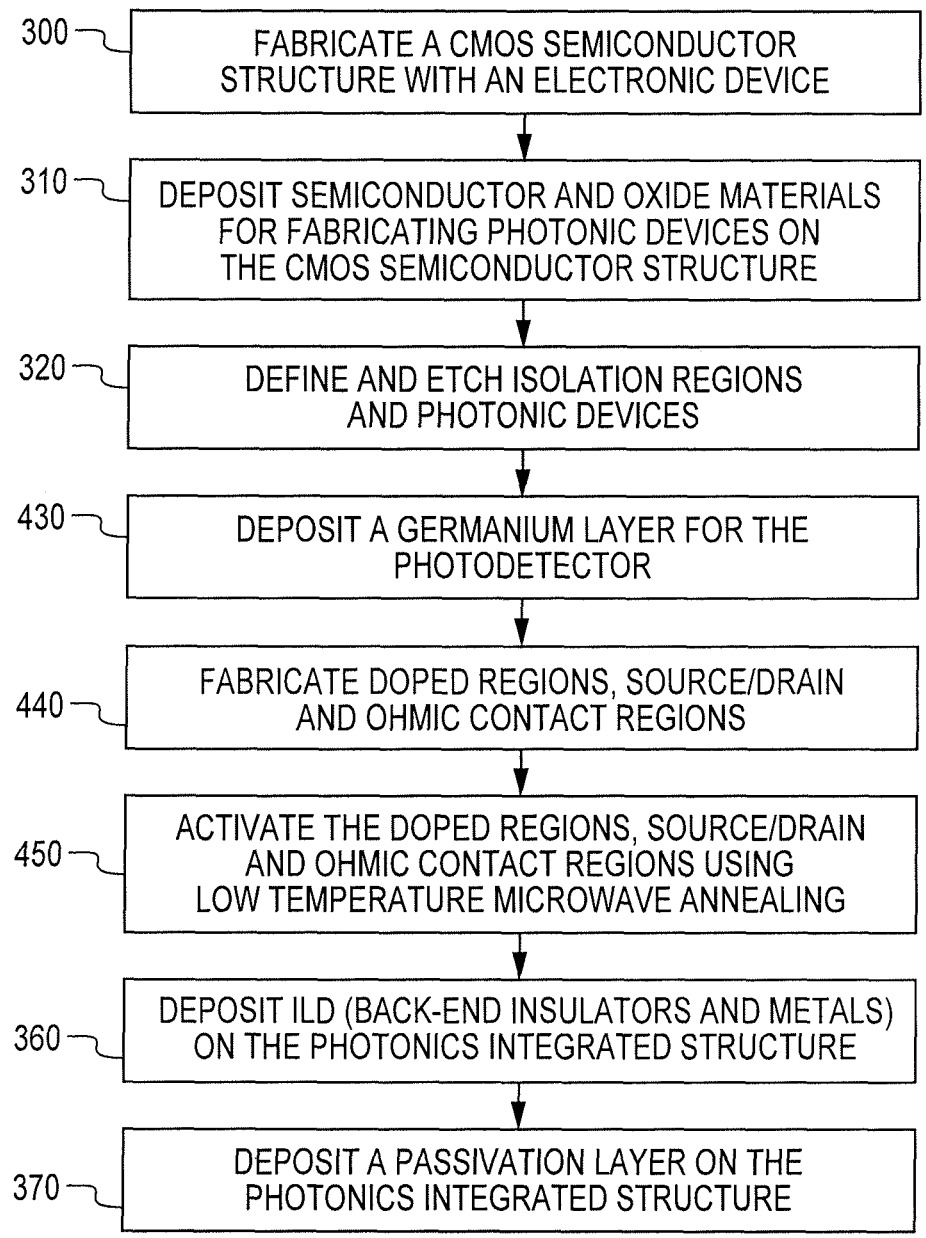

In this embodiment, dopant activation and annealing using the microwave annealing process in step 340 occurs after the semiconductor and oxide materials 251, 252, 253 step 310, isolation region 254 step 320 and doped region step 330, but before the germanium (or silicon-germanium) deposition step 360. In another embodiment, as shown in FIG. 3, the dopant activation and annealing step using low temperature microwave annealing occurs after the germanium (or silicon-germanium) deposition step 430 and after ohmic contact regions 263A, 263B, 263C, 263D are doped or applied. In FIG. 3, steps 300 to 320 are identical to the same numbered steps in FIG. 2. At step 430, the germanium (or silicon-germanium) material 262 is deposited on the silicon fabrication material 253, i.e. deposited on the waveguide 253a. At step 440, in addition to forming doped regions 261A, 261B within the silicon core 253b for modulator 250B in addition to ohmic contact regions 263C and 263D, as described above with reference to FIG. 2, ohmic contact regions 263A and 263B are also formed within germanium material 262 to create ohmic electrical contact regions. Ohmic contact regions 263A and 263B may be, for example, highly doped regions or low temperature formed silicides, such as Ni silicides. Silicon core 253b may also be doped. The dopants are those typically used in forming integrated circuits, e.g. boron, phosphorus, antimony, gallium and arsenic. At step 450, the silicon core 253b, doped regions 261A and 261B, and ohmic contact regions 263A, 263B, 263C, and 263D are activated using low temperature microwave annealing as described above in connection to step 340 of FIG. 2. Steps 370 and 380 in FIG. 3 are identical to the same numbered steps in FIG. 2.

While disclosed embodiments have been described in detail, it should be readily understood that the invention is not limited to the disclosed embodiments. Rather the disclosed embodiments can be modified to incorporate any number of variations, alterations, substitutions or equivalent arrangements not heretofore described. For example, while FIG. 1 shows a partial cross-section view of a semiconductor structure 200 fabricated with an exemplary photodetector, waveguide and modulator and an exemplary transistor, it shall be appreciated that the disclosed embodiments can be modified to fabricate the semiconductor structure 200 with other photonic devices such as, for example, modulators, demodulators, light sources, as well and other electronic devices such as transistors, diodes, and others. Accordingly, the invention is not limited by the disclosed embodiments but is only limited by the scope of the appended claims.

What is claimed as new and desired to be protected by Letters Patent of the United States is:

1. A method for fabricating an integrated structure, the method comprising:
   fabricating a CMOS structure containing an electronic device over a substrate, wherein the electronic device is formed using a first semiconductor material;
   fabricating a second semiconductor material over the first semiconductor material;

fabricating a buried oxide material between the first semiconductor material and the second semiconductor material, fabricating a photonic device using the second semiconductor material, the photonic device comprising a modulator having associated doped regions and a photodetector; and activating the doped regions with microwave energy such that the doped regions are heated to a temperature in the range of about 200 to about 500 degrees Celsius, wherein the buried oxide material is configured to function as a cladding for the photonic device.

2. The method according to claim 1, wherein the doped regions are heated to a temperature within the range of about 300 to about 400 degrees Celsius.

3. The method according to claim 1, wherein the second semiconductor material is thicker than the first semiconductor material in which the electronic device of the CMOS structure is formed.

4. The method according to claim 1, wherein the buried oxide material has a thickness greater than or equal to 1 micrometer and the second semiconductor material has a thickness greater than or equal to 200 nanometers.

5. The method according to claim 1, wherein the dopant is heated with microwave energy for at least about five minutes.

6. The method according to claim 5, wherein the dopant is heated with microwave energy for up to about two hours.

7. The method according to claim 1, wherein the activating step occurs using microwave at a frequency greater than or equal to about 1.5 GHz and less than or equal to about 8.5 GHz.

8. The method according to claim 1, wherein the activating step occurs using microwaves at a frequency of about 2.45 GHz and at a power of about 1300 W.

9. The method according to claim 1, wherein fabricating the photonic device comprises forming a waveguide using the second semiconductor material and a photodetector material in association with the waveguide.

10. The method according to claim 9, wherein the activating occurs before forming the photodetector material.

11. The method according to claim 9, wherein the activating occurs after forming the photodetector material.

12. The method according to claim 10, wherein the photodetector material comprises one of germanium and silicon-germanium.

13. The method according to claim 1, further comprising forming an electrical connection between a metallization material and the photonic device.

14. The method according to claim 13, further comprising forming an electrical connection between a metallization material associated with an electronic device in the CMOS structure and a metallization material associated with the photonic device.

15. The method according to claim 1, wherein the photonic device is fabricated after forming the first semiconductor material over the fabricated CMOS structure.

* * * * *